US008949573B2

(12) United States Patent
McCombs et al.

(10) Patent No.: US 8,949,573 B2
(45) Date of Patent: Feb. 3, 2015

(54) TRANSLATION LOOKASIDE BUFFER STRUCTURE INCLUDING AN OUTPUT COMPARATOR

(75) Inventors: Edward M. McCombs, Austin, TX (US); Chetan C. Kamdar, Austin, TX (US); William V. Miller, Austin, TX (US)

(73) Assignee: Apple Inc., Cupertino, CA (US)

( * ) Notice: Subject to any disclaimer, the term of this patent is extended or adjusted under 35 U.S.C. 154(b) by 699 days.

(21) Appl. No.: 13/097,286

(22) Filed: Apr. 29, 2011

(65) Prior Publication Data

US 2012/0124328 A1 May 17, 2012

Related U.S. Application Data

(60) Provisional application No. 61/414,574, filed on Nov. 17, 2010.

(51) Int. Cl.
*G06F 12/00* (2006.01)
*H03K 19/096* (2006.01)
*G06F 12/10* (2006.01)
*G11C 7/06* (2006.01)

(52) U.S. Cl.
CPC .............. *H03K 19/096* (2013.01); *G11C 7/062* (2013.01); *G06F 12/1027* (2013.01)
USPC ............................. 711/207; 711/108; 711/211

(58) Field of Classification Search
CPC ............ G11C 7/12; G11C 7/08; G11C 7/062; G11C 16/28
USPC .......................................................... 711/207
See application file for complete search history.

(56) References Cited

U.S. PATENT DOCUMENTS

| 4,858,180 | A | * | 8/1989 | Murdoch .................... 365/49.17 |
| 5,265,227 | A | | 11/1993 | Kohn et al. |
| 5,391,938 | A | * | 2/1995 | Hatsuda .......................... 327/71 |
| 5,440,707 | A | | 8/1995 | Hayes et al. |
| 5,530,822 | A | * | 6/1996 | Beavers et al. ............... 711/207 |
| 5,617,348 | A | * | 4/1997 | Maguire .................... 365/49.17 |
| 5,659,697 | A | * | 8/1997 | Dietz ............................. 711/207 |
| 5,802,594 | A | * | 9/1998 | Wong et al. ................... 711/167 |
| 5,860,147 | A | * | 1/1999 | Gochman et al. ............. 711/207 |

(Continued)

OTHER PUBLICATIONS

Rupak Samanta, et al., "Dynamic Aggregation of Virtual Addresses in TLB using TCAM Cells," 21st International Conference on VLSI Design, IEEE Computer Society, 2008, pp. 243-248.

(Continued)

*Primary Examiner* — Aimee Li
*Assistant Examiner* — Michael C Kolb
(74) *Attorney, Agent, or Firm* — Anthony M. Petro; Meyertons, Hood, Kivlin, Kowert & Goetzel, P.C.

(57) ABSTRACT

A processor includes a translation lookaside buffer (TLB) including a data array and a compare unit. The data array includes a number of entries each configured to store a respective translated physical address. In response to a read access to a given entry of the TLB, the data array is configured to output within a particular clock cycle, the respective translated physical address stored in the given entry. In addition the compare unit may be configured to compare the respective translated physical address output by the data array with a number of additional addresses. The compare unit may also be configured to provide a hit indication for each of the additional addresses within the particular clock cycle.

19 Claims, 11 Drawing Sheets

(56) References Cited

U.S. PATENT DOCUMENTS

| | | | |
|---|---|---|---|
| 5,907,867 A * | 5/1999 | Shinbo et al. | 711/207 |
| 5,936,873 A * | 8/1999 | Kongetira | 365/49.15 |
| 5,970,509 A | 10/1999 | Green | |
| 6,032,241 A * | 2/2000 | Green | 711/207 |
| 6,208,543 B1 * | 3/2001 | Tupuri et al. | 365/49.15 |
| 6,351,797 B1 * | 2/2002 | Beard et al. | 711/207 |
| 6,493,790 B1 | 12/2002 | Khieu et al. | |
| 6,549,997 B2 | 4/2003 | Kalyanasundharam | |
| 6,622,211 B2 | 9/2003 | Henry et al. | |
| 6,763,425 B1 * | 7/2004 | Pereira | 711/108 |
| 7,200,060 B2 | 4/2007 | Beatty et al. | |
| 7,330,936 B2 | 2/2008 | Tran et al. | |
| 7,426,627 B2 | 9/2008 | Wooten | |
| 7,447,867 B2 | 11/2008 | Soja et al. | |
| 7,509,472 B2 | 3/2009 | Caprioli et al. | |
| 7,620,791 B1 | 11/2009 | Wentzlaff et al. | |
| 7,712,098 B2 | 5/2010 | Chauvel et al. | |
| 2003/0196066 A1 * | 10/2003 | Mathews | 711/207 |
| 2004/0064654 A1 * | 4/2004 | Willis et al. | 711/150 |
| 2004/0193831 A1 | 9/2004 | Moyer | |
| 2005/0050278 A1 | 3/2005 | Meier et al. | |
| 2005/0108497 A1 * | 5/2005 | Bridges et al. | 711/207 |
| 2007/0255924 A1 * | 11/2007 | Moyer et al. | 711/202 |
| 2009/0129138 A1 * | 5/2009 | Sumita | 365/72 |
| 2010/0318761 A1 * | 12/2010 | Moyer et al. | 711/207 |
| 2011/0138149 A1 * | 6/2011 | Karlsson et al. | 711/207 |
| 2012/0173843 A1 * | 7/2012 | Kamdar | 711/207 |

OTHER PUBLICATIONS

U.S. Appl. No. 13/097,248, filed Apr. 29, 2011, Apple Inc, all pages.
U.S. Appl. No. 13/097,309, filed Apr. 29, 2011, Apple Inc, all pages.
U.S. Appl. No. 13/097,235, filed Apr. 29, 2011, Apple Inc, all pages.
Zhao Xue-mei, et al., A Fast Low Power Embedded Cache Memory Design, IEEE 2001, 4 pages.

* cited by examiner

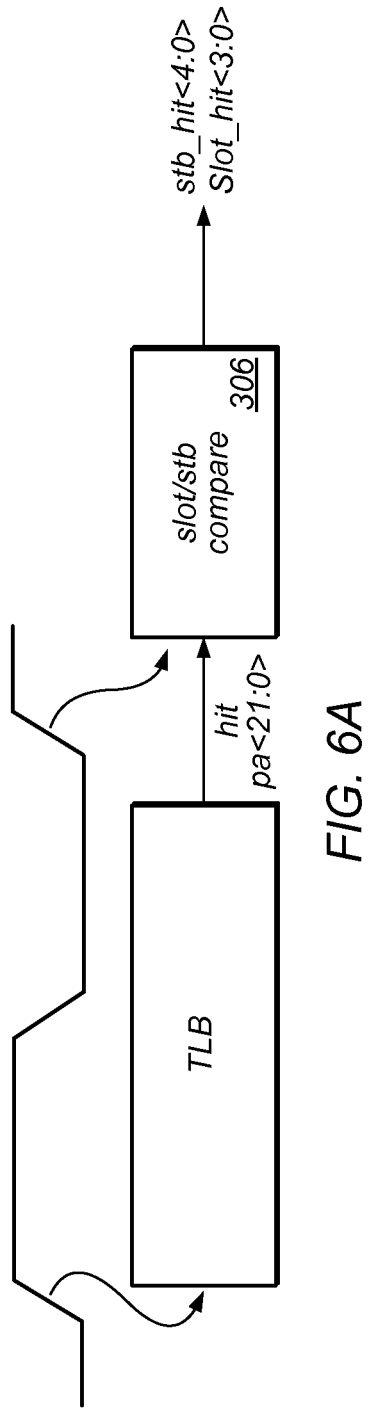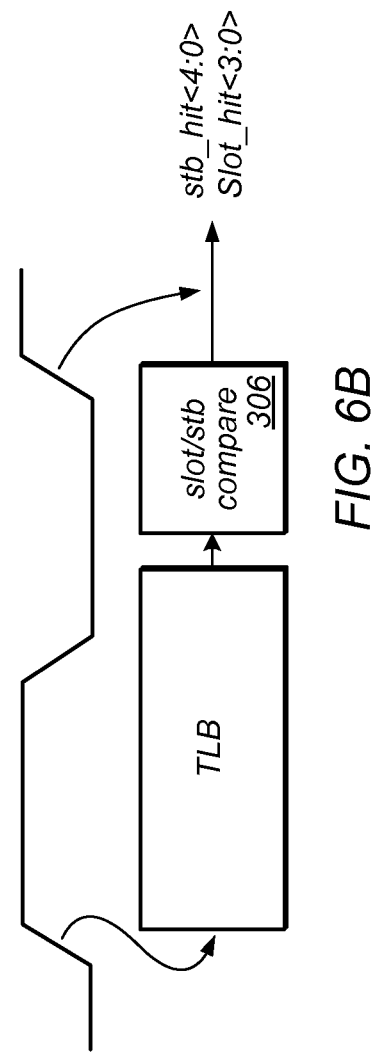

US 8,949,573 B2

TRANSLATION LOOKASIDE BUFFER STRUCTURE INCLUDING AN OUTPUT COMPARATOR

This patent application claims priority to Provisional Patent Application Ser. No. 61/414,574, filed Nov. 17, 2010.

BACKGROUND

1. Technical Field

This disclosure relates to processors, and more particularly to translation lookaside buffer mechanisms with in processors.

2. Description of the Related Art

Most processor designs that have paging mechanisms as part of the memory subsystem and include a translation lookaside buffer (TLB) to shorten the time required to do page translations and access memory. Although conventional TLB structures have been sufficient in providing physical address translations for a long time, in certain systems conventional TLB structures may not provide results fast enough.

SUMMARY OF THE EMBODIMENTS

Various embodiments of a translation lookaside buffer (TLB) are disclosed. In one embodiment, a processor includes a TLB including a data array and a compare unit. The data array includes a number of entries each configured to store a respective translated physical address. In response to a read access to a given entry of the TLB, the data array is configured to output within a particular clock cycle, the respective translated physical address stored in the given entry. In addition the compare unit may be configured to compare the respective translated physical address output by the data array with a number of additional addresses. For example, the additional addresses may be outstanding write requests such as memory writes that have not yet been serviced. The compare unit may also be configured to provide a hit indication for each of the additional addresses within the particular clock cycle.

In another embodiment, a mobile communication device includes a memory and a processor. The processor includes a translation lookaside buffer (TLB) unit that includes a data array unit that may be configured to output within a particular clock cycle, a translated physical address in response to a read request to a particular entry of the data array unit. The TLB also includes a compare unit that may be configured to concurrently compare the translated physical address with a number of additional addresses that may correspond to outstanding write requests. The compare unit may provide a hit indication for each of the additional addresses within the particular clock cycle.

BRIEF DESCRIPTION OF THE DRAWINGS

FIG. 6A is a diagram illustrating timing details of one embodiment of a translation lookaside buffer.

FIG. 6B is a diagram illustrating timing details of an embodiment of the translation lookaside buffer shown in FIG. 3 and FIG. 4.

Figure 1:
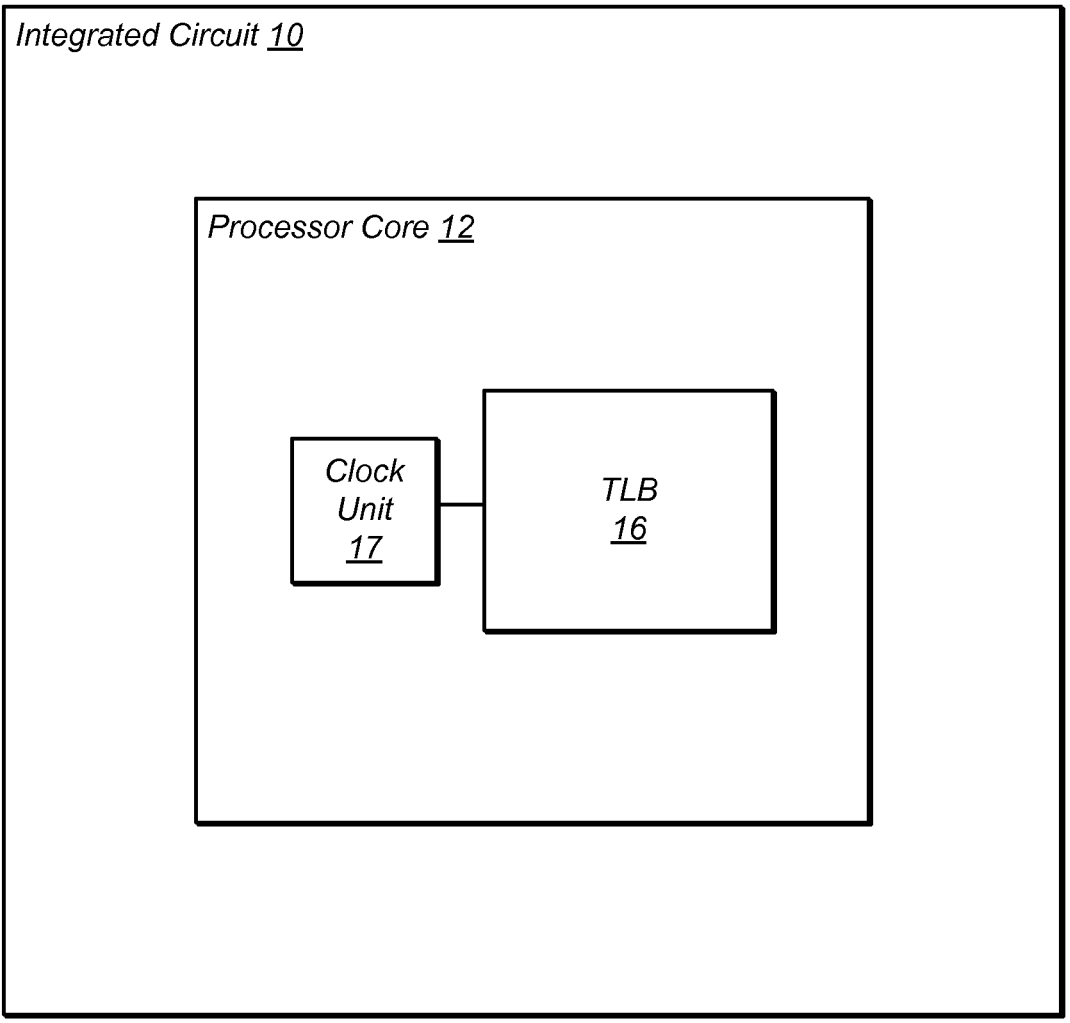
FIG. 1 is a block diagram of one embodiment of an integrated circuit including a translation lookaside buffer and clock unit therefor.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of an integrated circuit including a translation lookaside buffer and clock unit is shown. The integrated circuit 10 includes a processor core 12 that includes a translation lookaside buffer (TLB) 16 and a clock unit 17. In one embodiment, the integrated circuit 10 may be considered as a system on a chip (SOC).

In various embodiments, the processor core 12 may execute application software as well as operating system (OS) software. In addition, the processor core 12 may include a memory subsystem including one or more cache memories (not shown). The memory subsystem may implement a paging system in which virtual address are translated to physical addresses when physical memory is accessed.

In one embodiment, the TLB 16 may be configured to store physical addresses that have been previously translated. As described further below, the TLB 16 may be configured to receive at least a portion of a virtual address and determine whether the corresponding physical address is stored within the TLB 16. In addition, the TLB 16 may include a data array (e.g., 304 of FIG. 3) that includes a multiplexing structure for providing the physical address stored in the data array, or to provide a bypassed address dependent upon an enable signal. Further, the TLB 16 may include a fast compare unit (e.g., 306 of FIG. 3) that may be configured to generate a hit or miss indication for as many as number of different previous addresses when compared to the output of the data array. The TLB 16 may also be configured to provide the data array output and the results of the previous address compare within the same clock cycle. The clock unit 17 may provide at least one pulse clock signal (e.g., clk_out of FIG. 10) to the TLB 17 during normal operation. In addition, the clock unit 17 may be configured to enable and disable the pulse clock signal from within the clock unit 17 during various test modes such as scan test, functional test, and the like.

Figure 2:
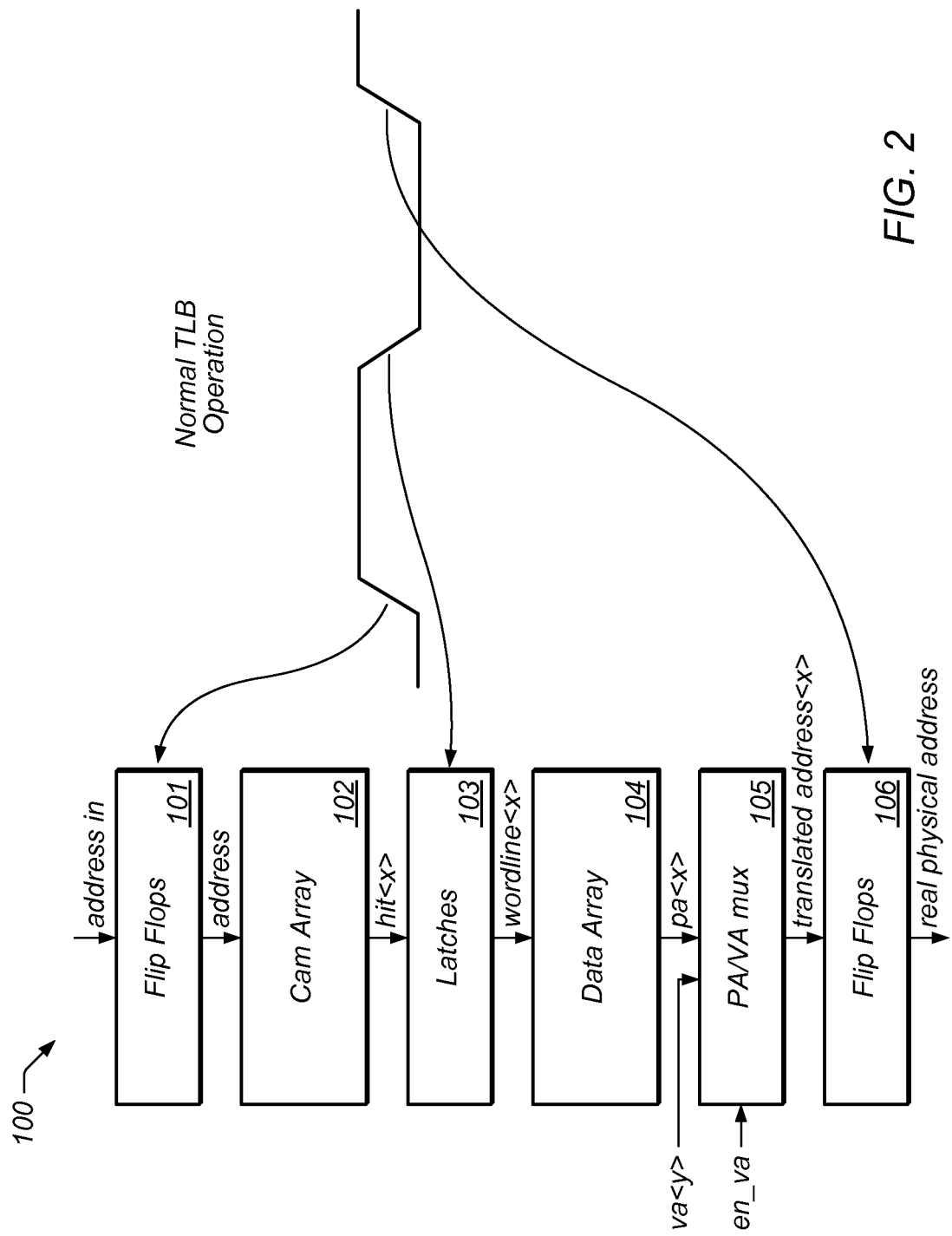
FIG. 2 is a block diagram of one embodiment of a translation lookaside buffer.

Referring to FIG. 2, a block diagram of one embodiment of a TLB is shown. The TLB 100 of FIG. 1 includes a set of flip-flops 101 at the input to the content addressable memory (CAM) array 102. The CAM array 102 stores at least a portion of the physical address tag bits for each translation (i.e., physical address, (PA)) that is stored within the data array 104. The flip-flops capture an input address (e.g., address in) which is compared by the CAM array 102 to every physical address tag that is stored within the CAM array. If there is a hit, the hit indication may be a wordline address to the location in the data array that contains the physical address. The wordline address may be latched by latches 103. The data array 104 is accessed using the wordline address, and the physical address is output to the PA/VA mux 105. In some cases, another address may be provided to the TLB along with an asserted bypass signal, such as the en_va signal, for example. In such cases, the asserted en_va signal selects the other address rather than the translated PA stored within the data array 104. If there is no bypass enabled, the PA from the accessed entry is passed through the mux 105 and is captured at the output flip-flops 106. The translated PA is then output for use by the memory subsystem. If there is a bypass enabled through the en_va signal, the address provided on the va<y> address is instead passed to the pa/va mux 105. Accordingly, on a read, the translated PA is accessed and then the en_va signal selects one of the PA or the va<y> address for output. The final output is the Physical address (PA) whether it's a virtual address from va<y> or the PA stored in the data array 104.

Figure 3:
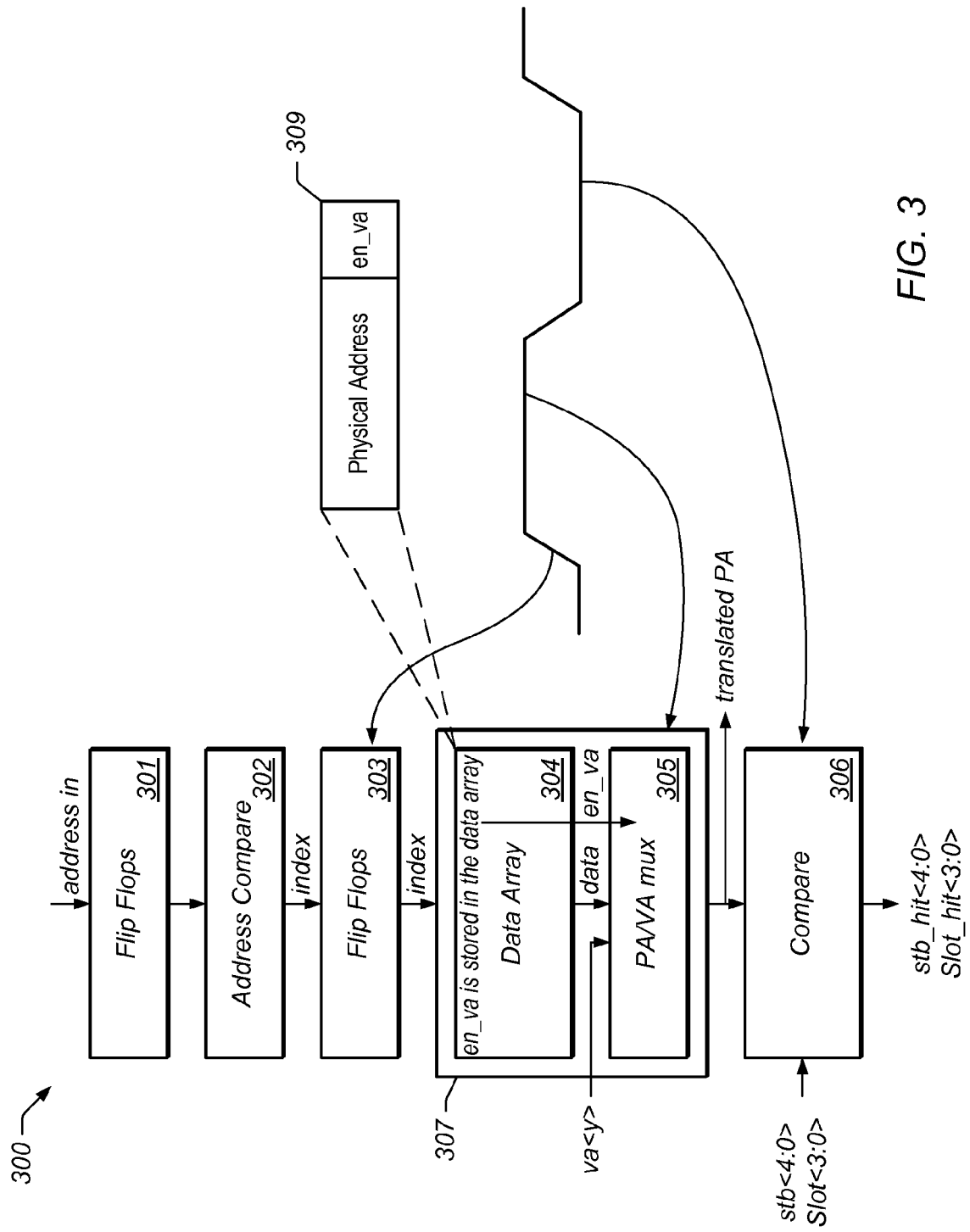
FIG. 3 is a block diagram of one embodiment of the translation lookaside buffer of FIG. 1.

Referring to FIG. 3, a block diagram of one embodiment of the TLB of FIG. 1 is shown. The TLB 300 includes a set of flip-flops 301 coupled to an address compare unit 302, which is coupled to another set of flip-flops 303. The flip-flops 303 are coupled to the data array unit 307, which includes a data array 304 and a pa/va multiplexer (mux) 305. The data array unit 307 is coupled to a compare unit 306.

In one embodiment, the TLB 300 receives an address (e.g., address in) such as a physical address tag for example, during a read operation. The flip-flop unit 301 captures the address and provides it to the address compare unit 302, which provides an index into the data array 304 if there is a hit. The index is used to access the corresponding translated physical address that is stored within data array 304. As shown in the exemplary data array entry 309, in addition to the physical address, the en_va indication is also stored along with the physical address. The en_va indication is used to determine whether to use the physical address stored within the data array 304, or to use the va(y) address provided to the data array unit 307. Thus, the en_va signal is referred to as an address selection indication. As described further below, the wordlines may be generated for both the va(y) address and the physical address stored within the data array 304. Since the en_va indication is stored with the PA address data in the data array 304 during a TLB write operation, the stored indication may be used to select which data is output at the time the address is read out of the data array. This may allow for a much faster data output, than for example, the TLB shown in FIG. 2. It is noted that although not explicitly shown, TLB 300 includes control logic that controls the reading and writing of the data array unit 307.

In addition, as described further below, the compare unit 306 may compare the translated physical address (or the va<y> address) to a number of previously requested addresses (e.g., slot <3:0> and stb<4:0>) and to provide a number of corresponding hit indications. In one embodiment, the slot <3:0> addresses may correspond to outstanding request addresses, and the stb<4:0> addresses may correspond to outstanding store buffer addresses, which represent outstanding memory writes. As shown, in one embodiment, the address output from the data array unit 307 and the compare unit 306 may occur in the same clock cycle. The translated PA may be used by the memory subsystem to access the system memory, as desired. The compare unit 306 may concurrently compare the translated PA to the previously requested addresses that are input to the compare unit 306. The compare unit 306 provides corresponding match results for each of the compare operations (e.g., slot_hit <3:0> and stb_hit<4:0>).

Figure 4:
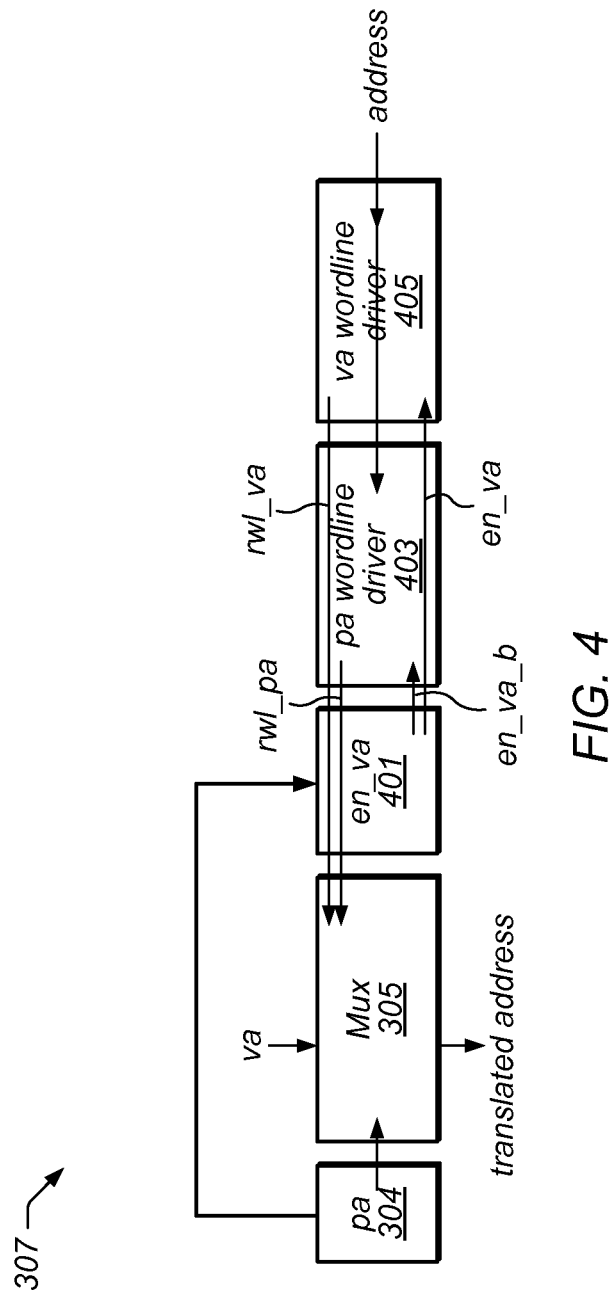
FIG. 4 is a block diagram illustrating more detailed aspects of an embodiment of a portion of the translation lookaside buffer of FIG. 3.

Turning to FIG. 4, a block diagram illustrating more detailed aspects of an embodiment of a portion of the translation lookaside buffer of FIG. 3 is shown. Specifically, a conceptual diagram of the wordline drivers of the data array 304 and the mixing structure 305 of data array unit 307 is shown. More particularly, as shown in FIG. 3 and FIG. 4, the va/pa mux 305 is placed within the data array unit 307.

Since the en_va indication is stored with the address data within each data array entry, the en_va signal 401 is routed back to both the va wordline driver 405 and the pa wordline driver 403 as en_va and en_va_b, respectively. During a write of the data array the en_va signal is stored and may subsequently enable and thus turn on one of va wordline driver 405 or the pa wordline driver 403. During a subsequent read cycle, if the va wordline driver 405 is enabled by the en_va signal 401, then a va that may be provided to the pa/va mux would be read out. Alternatively, if the pa wordline driver 403 is enabled by the en_va signal 401, then the PA address data from the data array 304 would be read out. The va/pa mux 305 has already selected the corresponding address via the en_va signal, and so it is completely hidden from a timing perspective. This is shown in more detail in FIG. 5. In the conventional TLB of FIG. 2, since the PA or VA would have been selected after the address data is read from the data array, at least one additional stage delay would have been incurred.

Figure 5:
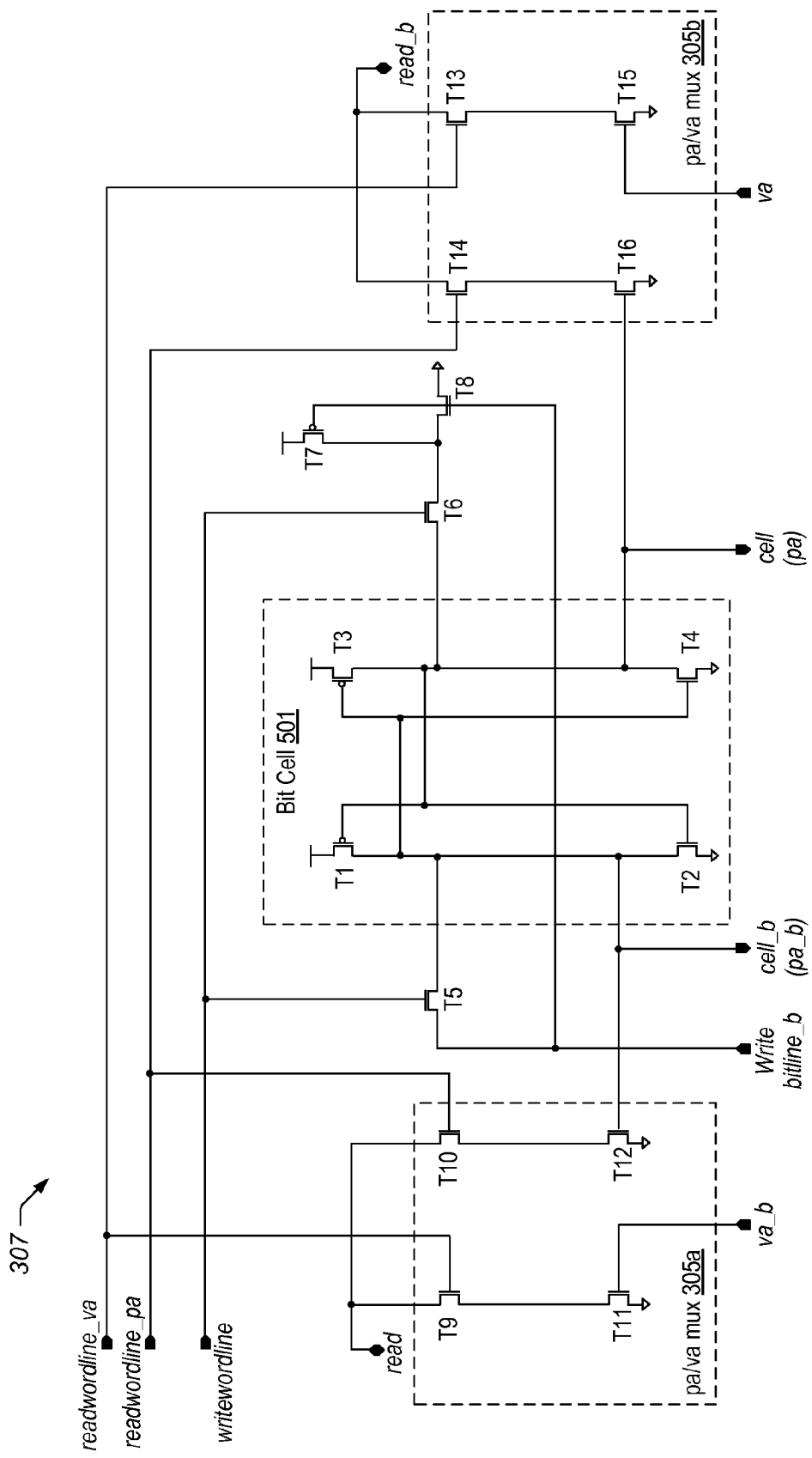
FIG. 5 is a schematic diagram of an embodiment of a portion of the translation lookaside buffer shown in FIG. 3 and FIG. 4.

Referring to FIG. 5, a schematic diagram of an embodiment of a portion of the translation lookaside buffer shown in FIG. 3 and FIG. 4. More particularly, the schematic of FIG. 5 illustrates the integrated mixing structure and a bit cell of the data array 304. In the illustrated embodiment, the bit cell 501 includes the four cross-coupled transistors T1 through T4. Transistor T5 and T6 correspond to write wordline transistors the bit cell 501. Transistors T7 and T8 correspond to bitline transistors that are used for writing a bit of data into the bit cell 501. The pa/va mux is shown in two parts, 305a and 305b. The pa/va mux 305a corresponds to the portion of the mux that outputs either the va_b or the pa_b bit, while the pa/va mux 305b portion outputs either the va or the va bit. As shown, the pa/va mux 305a includes transistors T9 and T10 which correspond to the read wordline pass transistors for va and pa, respectively, while transistors T11 and T12 correspond to the va_b and pa_b data transistors, respectively. Similarly, the pa/va mux 305b includes transistors T13 and T14 which correspond to the read wordline pass transistors for va and pa, respectively, while transistors T15 and T16 correspond to the va and pa data transistors, respectively.

When a data write to the data array 304 occurs, the write bitline_b signal has the negated data bit value. For example, if the data bit being written has a logic value of one, the write bitline_b signal path would have a logic value of zero. As such, transistor T7 would turn on thereby causing a logic value of one to appear at the gates of transistors T1 and T2 when wordline transistor T6 is on. Similarly, the logic zero on the write bitline_b path would appear at the gates of transistors T3 and T4, thereby causing a logic zero to appear at the cell pa_b output, and a logic one to appear at the cell pa output. Accordingly, the bit is now stored within the bit cell of data array 304.

Upon a subsequent read of the data array 304, and more particularly, the entry in which this bit cell 501 is positioned, the en_va signal described above has already selected which of the readwordlines is turned on. Specifically, as described above in conjunction with FIG. 4, when a data write to the data array 304 occurs, the en_va bit is written, and sent to the wordline drivers, thereby enabling one of the pa or the va wordlines. Accordingly, in FIG. 5, depending upon whether the en_va bit is a one or a zero, one of the readwordline_va or the readwordline_pa signals is asserted to a logic value of one upon a subsequent read. Thus, due to the en_va signal, the readwordline_va and the readwordline_pa signals are mutually exclusive. When the entry is read, only one of transistors T9 or T10 is on, and only one of T13 or T14 is on. This allows either the corresponding pa data from the bit cell 501 or va address data applied to the va address inputs to be immediately read out on the read and read_b signal paths, rather than having to wait for the address data to be read out in the next cycle as in previous designs. Thus, bringing the pa/va mux logic into the data array 304 allows the address to be output faster.

Turning to FIG. 6A a diagram illustrating timing details of an embodiment of a translation lookaside buffer is shown. As shown, the physical address compare and subsequent hit indications are provided in the cycle after the address data (e.g., pa<21:0>) is provided from the data array of the TLB. Generally speaking, the TLB is done in a cycle and the output of the data array (i.e., hit+PA) goes downstream for further qualifying of data in the next cycle. This is done because the cycle time for the TLB takes too long.

In FIG. 6B, a diagram illustrating timing details of an embodiment of the translation lookaside buffer shown in FIG. 3 and FIG. 4 is shown. In contrast to the diagram shown in FIG. 6A, the timing diagram of FIG. 6B shows that the physical address compare and subsequent hit indications (e.g., stb_hit <4:0> and slot_hit <3:0>) are provided in the same cycle that the address data is provided from the data array of the TLB, thereby speeding up the overall TLB process.

In various embodiments, shortening the time that it takes for the PA address to be output from the data array 304 may enable the compare unit 306 to perform the compare operation in the same cycle that the PA address is provided from the data array 304. As described in the above embodiments, one mechanism for decreasing the time that it takes for the PA address to be output from the data array 304 is to store the en_va indication with the corresponding address in each entry of the data array 304, and routing the en_va signal to the PA and VA wordline drivers. Another mechanism may be the integration of the pa/va mux 305 into the data array 304.

Furthermore, not only does the rest of the processing unit 12, for example, not have to wait an additional cycle for the hit results, a set of latches may be eliminated. More particularly, in FIG. 6A, since the compare unit 306 compares the PA with the slot and stb addresses at the beginning of the cycle following the TLB result, the slot and stb addresses need to be latched to ensure setup times for the compare unit 306 can be met. In contrast, in FIG. 6B, since the compare takes place in the latter part of the earlier cycle, the setup time for the slot and stb addresses is not an issue since the setup time is coincident with the time the TLB takes to output the PA. Thus, the latches may be eliminated.

Figure 7A:
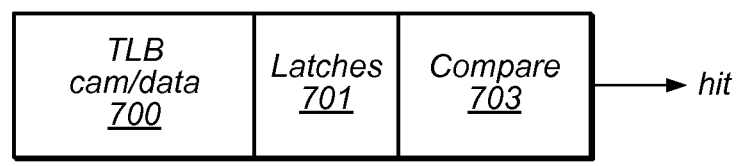
FIG. 7A is a block diagram an embodiment of a translation lookaside buffer.

Turning to FIG. 7A, a conceptual block diagram of an embodiment of a translation lookaside buffer is shown. As shown, there is a latch stage after the data is output from the data array. More particularly, to perform a compare operation after a conventional TLB, the results of the TLB 700 are latched or flopped by latches 701 and then fed to the compare. The latch 701 is needed to hold the TLB results for the entire time that compare unit 703 compares addresses. There may be several drawbacks to using the latch 701. For example, the latch 701 consumes power and area, and the latch 701 may include multiple stages and so may slow down the process of providing the result. Furthermore, the front end of the compare unit 703 is typically clocked due to setup/hold issues.

Figure 7B:
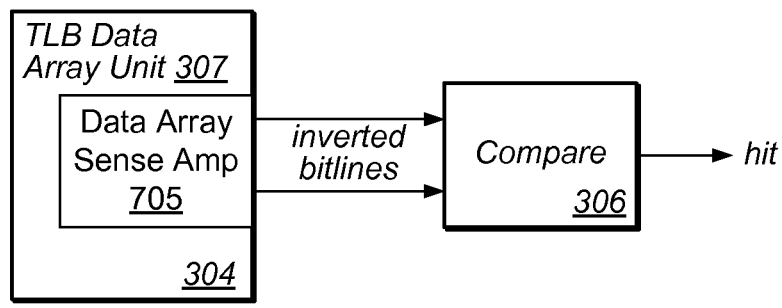
FIG. 7B is a block diagram of an embodiment of the translation lookaside buffer shown in FIG. 3 and FIG. 4.

In contrast, a conceptual block diagram of an embodiment of the translation lookaside buffer shown in FIG. 3 and FIG. 4 is shown in FIG. 7B. In the embodiment shown in FIG. 7B, there is no latch. Instead, the bitline output of the data array sense amplifiers 705 is used to feed the compare unit 306. The hold issue is resolved by using the bitline as the data element. In one embodiment, the bitline output of the a given data array storage cell is precharged high and conditionally discharges low. However, this bitline is then inverted by the sense amplifier. The inverted bitline precharges low and is conditionally evaluated high. In one embodiment, the clock is built into the bitlines, since both the data and the clock are merged into a single line. More particularly, at some point during each clock cycle, the bit lines of the sense amp 705 are precharged low, and then at some other point in the clock cycle the bit lines are evaluated and the data from the storage cell will drive one or the other bit line high. This reduces the need for the clock on the front end of the compare unit 306, which may reduce the front end timing by 1 stack. In addition, because the sense amp 705 is used to send the data to the compare, a closer physical placement may be used, which may reduce signal delay that may be attributed to long wires.

Figure 8:
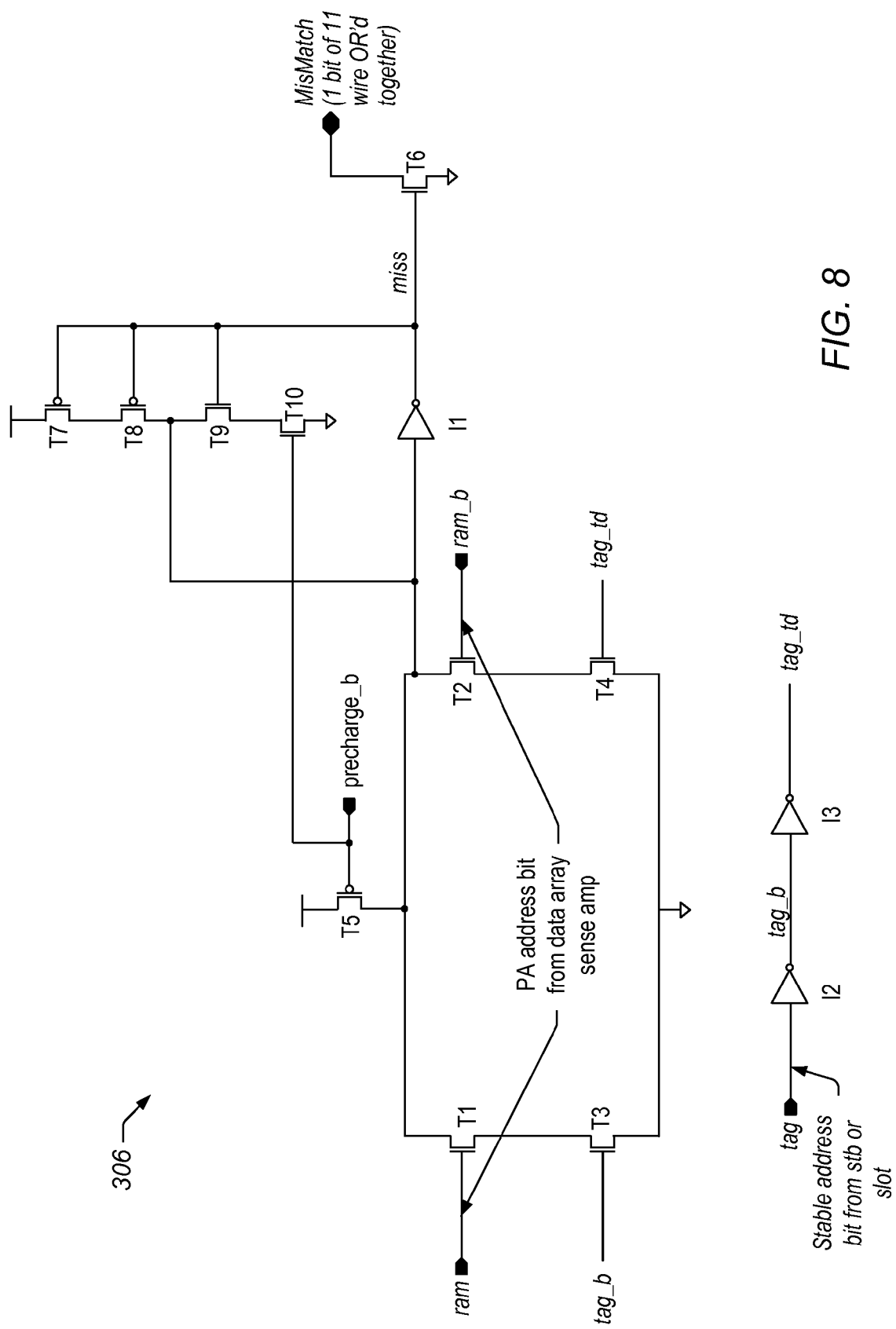
FIG. 8 is a schematic diagram of one embodiment of a portion of the compare unit shown in FIG. 3.

Turning to FIG. 8, a schematic diagram of one embodiment of a portion of the compare unit of FIG. 3 is shown. More particularly, the embodiment shown in FIG. 8 is representative of one bit of the compare unit 306. Compare unit 306 includes transistors T1 through T10, and inverters I1 through I3. The inputs are the ram and ram_b signals, and the tag signal. The output is the Mismatch signal, which stays at a logic one to indicate a hit or match, and goes to logic zero to indicate a miss or mismatch.

The ram and ram_b signals are precharged low differential signals that represent the PA address bit from the data array 304. As such, if the PA address bit is a logic one, then the ram bit will evaluate to a logic one, and conversely if the PA address bit is a logic zero, the ram_b bit will evaluate to a logic one. The tag signal represents a single-ended stb or slot address bit that is being compared to the PA address bit. As shown in FIG. 8, the tag input corresponds to a stable stb or slot address bit. Thus, the tag_b bit is simply an inverted tag bit, and the tag_td bit is a delayed version of the tag bit. Accordingly, if the tag address bit is a logic one, the tag_td bit will go to a logic one, and conversely if the tag address bit is a logic zero, the tag_b bit will go to a logic one. As shown in the illustrated embodiment, transistor T1 and transistor T3 are comparing ram against tag_b, and transistor T2 and transistor T4 are comparing ram_b against tag. Thus, transistor T1 and transistor T3, and transistor T2 and transistor T4 are looking for a mismatch.

Transistor T5 precharges the input of inverter I1 to a logic one in response to a logic zero precharge pulse on the precharge_b signal path, thereby keeping transistor T6 cut off. More particularly, when transistor T5 turns on during the precharge pulse, both of transistors T7 and T8 are turned on, which latches the precharge value at the output of I1, and which keeps transistor T6 cut off and indicating a hit on the mismatch output signal. When the precharge pulse returns to a logic one, transistor T5 turns off and transistor T10 turns on. However, since transistor T9 is in cutoff no current flows through transistor T10.

The PA address bit from the data array sense amp is applied to transistors T1 and T2 as ram and ram_b, respectively, while the slot or stb address bit is applied to transistors T3 and T4 as tag_b and tag_td, respectively. When the PA address bit evaluates, one of the ram or ram_b bits will go to a logic one. Similarly, one of the tag_b or tag_td bits will go high. If neither the ram and tag_b nor the ram_b and tag_td bits are the same, then there is a match or hit. However, if either the ram and tag_b or the ram_b and tag_td bits are the same, then a mismatch has occurred.

In the case of a match or hit, neither of T1 and T3, nor T2 and T4 turned on at the same time. Thus, the input to inverter I1 remains the same, and the Mismatch signal continues to indicate a hit. However, in the case of a mismatch, one of T1 and T3, or T2 and T4 turned on. Thus, the input to inverter I1 is pulled to a logic zero which turns on transistor T6, and causes the Mismatch signal to indicate a miss by going to a logic zero. In addition, the transition of the output of inverter I1 to a logic one causes transistor T9 to turn on and transistors T7 and T8 to turn off, thereby latching the mismatch indication until the next precharge cycle.

It is noted that the stb and slot addresses need to be stable prior to the end of the precharge pulse returning to a logic one and prior to the evaluation of the ram and ram_b signals. As described above, the compare operation may be performed in the next subsequent cycle after the data array provides the PA. In such an embodiment, the stb and slot addresses may be latched to provide adequate setup and hold times for the compare operation. However, in other embodiments, the compare operation may be performed in the same cycle as, and after the data array provides the PA. In such embodiments, the stb and slot addresses may become sufficiently stable without the use of a latch due to the compare operation occurring near the end of the cycle.

In one embodiment, there may be 22 address bits being compared substantially simultaneously. Accordingly, there may be 21 circuits similar to the circuit shown in FIG. 8 within compare unit 306, which are not shown for brevity. However, as shown in FIG. 8, the output hit signal (mismatch) is wire OR-ed with the other similar circuits such that if there is a mismatch on any output bit, the mismatch signal is driven to a logic level of zero. It is noted that although there are 22 address bits in the instant embodiment, any number of address bits may be used in other embodiments.

Figure 9:
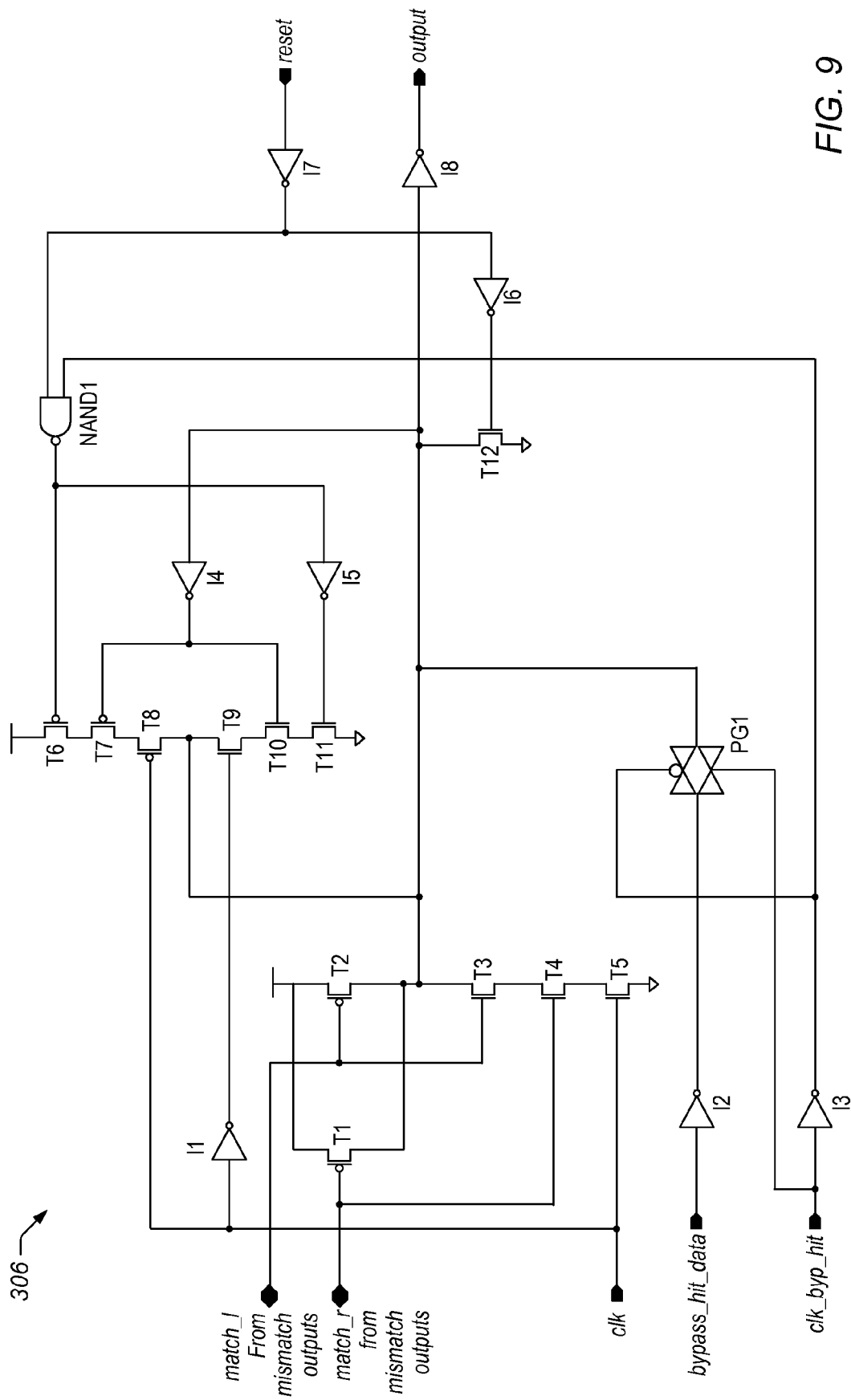
FIG. 9 is a schematic diagram of one embodiment of another portion of the compare unit shown in FIG. 3.

Referring to FIG. 9, a schematic diagram of one embodiment of another portion of the compare unit of FIG. 3 is shown. More particularly, the embodiment shown in FIG. 9 is representative of a two-stage output latch that may be used to latch the compare (mismatch) outputs of the circuit of FIG. 8. The two-stage latch of FIG. 9 includes transistors T1 through T12, and inverters I1 through I8.

As shown, the mismatch output from FIG. 8 is applied to the match_1 or the match_r input of the circuit of FIG. 9. As described above there may be as many as two sets of 11 circuits like the circuit shown in FIG. 8, the outputs of which are all connected together in a wire OR configuration such that 11 are connected to the match_1 input and 11 are connected to the match_r input. In the illustrated embodiment, the latch may operate in three different modes: functional, bypass, and reset.

In the functional mode, both the clk_byp_hit and the reset signals are held low. When the clk signal is at a logic value of one (high), the inputs to transistors T1-T4 are evaluated and allowed to change, when the clk signal transitions to a logic value of zero (low), the input value is latched. More particularly, when the clk signal is high transistor T5 is turned on, and if both of the match inputs are high, then the input to inverter I8 goes low, thereby causing the output signal to go high. Conversely, if the any of the inputs goes low, one of transistors T1 or T2 will turn on, causing the input to inverter I8 to go high, thereby causing the output signal to go low.

Transistors T6-T11 form a feedback loop, which may reinforce and latch a data value during functional mode operation. While the clk signal is high, transistors T8 and T9 are both off, which turns off the feedback loop (i.e., T6-T11) to eliminate a "force" change of data if the opposite data was there before. This may allow logic values to change faster when a new data value arrives. While reset is low, and the clk_byp_hit are both low, the output of the NAND-gate (e.g., NAND1) is low, thereby turning on transistors T6 and T11 which allows the data values at the input of inverter I8 to be latched once the clk goes low. Thus, if the input to the inverter I8 is low, then transistor T7 is off and transistor T10 is on. However, if input to the inverter I8 is high, then transistor T7 is on and transistor T10 is off.

When the clk signal goes low, transistor T5 turns off. However, transistors T8 and T9 turn on. If the input to the inverter I8 is low, and transistor T10 is on, then the logic value of zero at the input to the inverter I8 is reinforced and latched by the feedback loop. If, however, the input to the inverter I8 is high and transistor T7 is on, then the logic value of one at the input to the inverter I8 is reinforced and latched by the feedback loop.

In the reset mode, the reset signal goes high while the clk and clk_byp_hit signals are held low. Thus transistors T6 and T11 are turned off, which turns off the feedback loop. Transistor T12 turns on, thereby pulling the input to the inverter I8 low, and forcing the output signal high.

During various test modes, it may be desirable to bypass the input signal data. Accordingly, in the bypass mode the clk and reset signals are kept low, and the clk_byp_hit signal is forced high, which turns on the pass gate (e.g., PG1). The clk_byp_hit signal going high forces the output of the NAND 1 gate high, turning off transistors T6 and T11, and thereby turning off the feedback loop to remove the force if opposite data was stored in the latch. Bypass data may be applied as desired at the bypass_hit_data input, where it is inverted by both the inverters I3 and I8, and output at the output.

Figure 10:
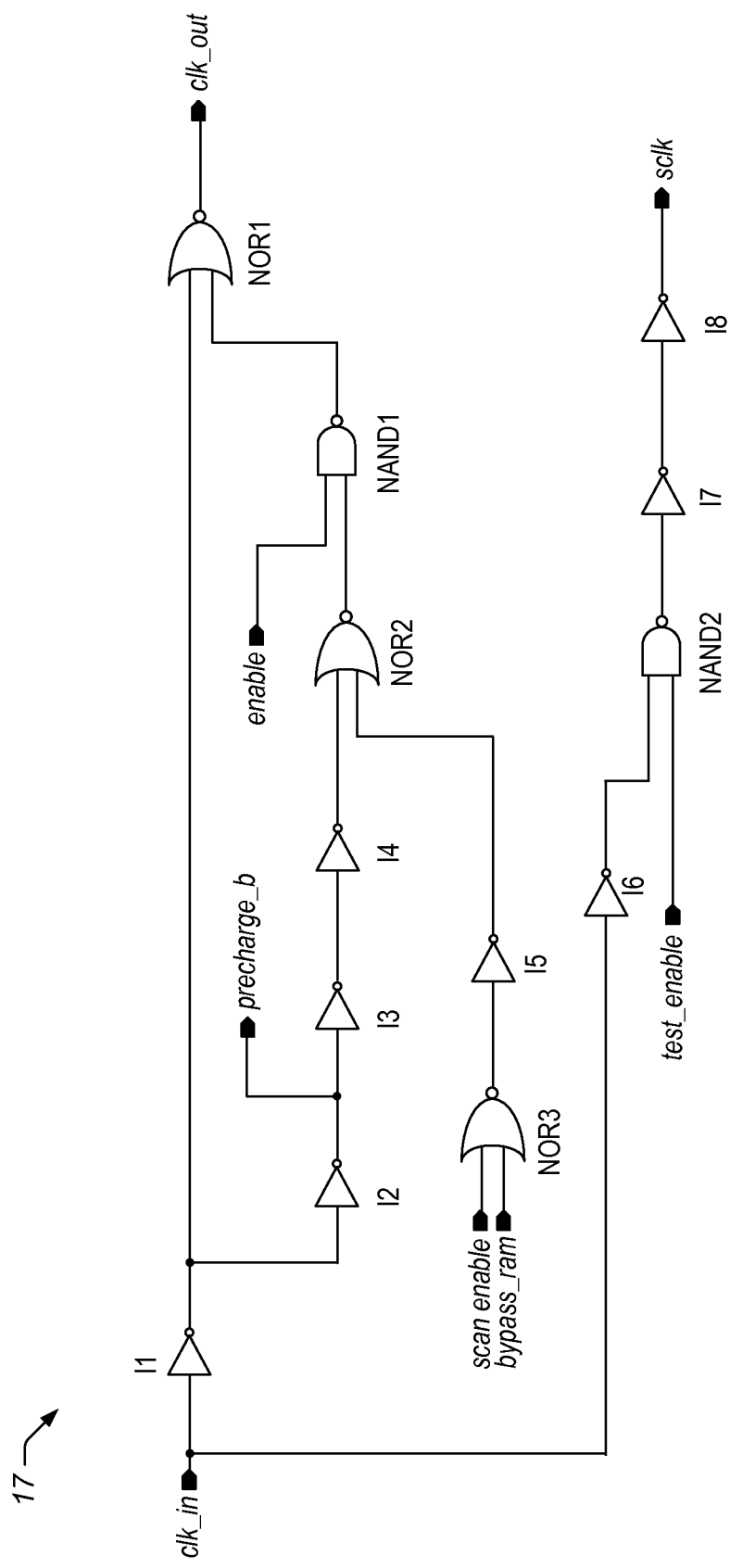
FIG. 10 is a schematic diagram of one embodiment of the clock unit shown in FIG. 1.

Turning to FIG. 10, a schematic diagram of one embodiment of the clock unit of FIG. 1 is shown. The clock unit 17 includes an inverter I1, the input of which receives an input clock signal (e.g., clk_in). The output of the inverter I1 is coupled to one input of a NOR-gate (e.g., NOR1). The output of the NOR1 gate is an output clock (e.g., clk_out). The output of the inverter I1 is also coupled to the input of an inverter I2, the output of which is coupled to an inverter I3 and which is also the precharge_b signal. The output of the inverter I2 is coupled to an inverter I4, which is in turn coupled to one input of a NOR-gate (e.g., NOR2). The output of the NOR2 gate is coupled to one input of a NAND-gate (e.g., NAND1), the output of which is coupled to the other input of the NOR1 gate. The other input to the NAND1 gate is an enable signal. The clock unit 17 also includes a NOR-gate (e.g., NOR3) which is coupled to receive a scan enable signal and a bypass_ram signal. The output of the NOR3 gate is coupled to an inverter I5, the output of which is coupled to the other input to the NOR2 gate. The clock unit 17 further includes an inverter I6 that is coupled to receive the clk_in signal. The output of the inverter I6 is coupled to one input of a NAND-gate (e.g., NAND2), the output of which is coupled to an inverter I7, which is in turn coupled to an inverter I8, which provides an output scan clock signal (e.g., sclk). The other input to the NAND2 gate is coupled to receive an input signal (e.g., test_enable).

The clock unit 17 may be used to form a pulse clock signal from the clk_in signal. More particularly, the clk_out signal may have a pulse width that corresponds to five time delays. The time delays correspond to the propagation delays associated with the five components (e.g., I2, I3, I4, NOR2, and NAND1) that form a delay chain as the second input to the NOR1 gate.

In various embodiments, the clk_out signal may be used as the evaluate clock for dynamic logic circuits in the TLB and other circuits. Similarly, the precharge_b signal may be used to precharge dynamic logic circuits in the TLB and other circuits. For example, in FIG. 8, the precharge_b signal is used to precharge a portion of the logic. The scan enable signal may be used to enable scan testing. For example, the scan enable signal may be used to gate the normal clock, clk_out, and to switch scannable logic elements such as flip-flops, for example, to accept a scan input rather than a normal data input. The bypass_ram signal may be used during a memory test to turn off the normal clock, clk_out.

Logic within the clock unit 17 may be used to turn off the clk_out signal during testing modes such as scan test for example. More particularly, the scan enable signal and the bypass_ram signal when asserted to a logic value of one, effectively gate the clk_out signal, while the scan enable signal gates the clk_in signal when asserted to a log value of zero.

In a conventional clock generation scheme, the logic for enable, scan enable, and bypass_ram is provided outside the pulse clock unit 17. More particularly, the inverter I1 and I2 may need to be duplicated every place that the precharge_b signal is needed. For the enable signal, which may be a primary input used to shut off the clk_out signal, a latch of flip-flop may be needed to latch the enable signal. In addition, the elk_ out signal may be delayed so that the enable signal can be latched and provided to some clock gating signal. Furthermore, the enable signal itself may need to be routed to wherever the clk_out clock gating logic is located.

Accordingly, in the embodiment shown in FIG. 10, area may be saved by using the pulse of the control circuit to shut off the clk_out for functional and test modes. The pulse also features a faster precharge shut off to remove precharge/ enable current at the front end of the downstream dynamic latch.

Figure 11:
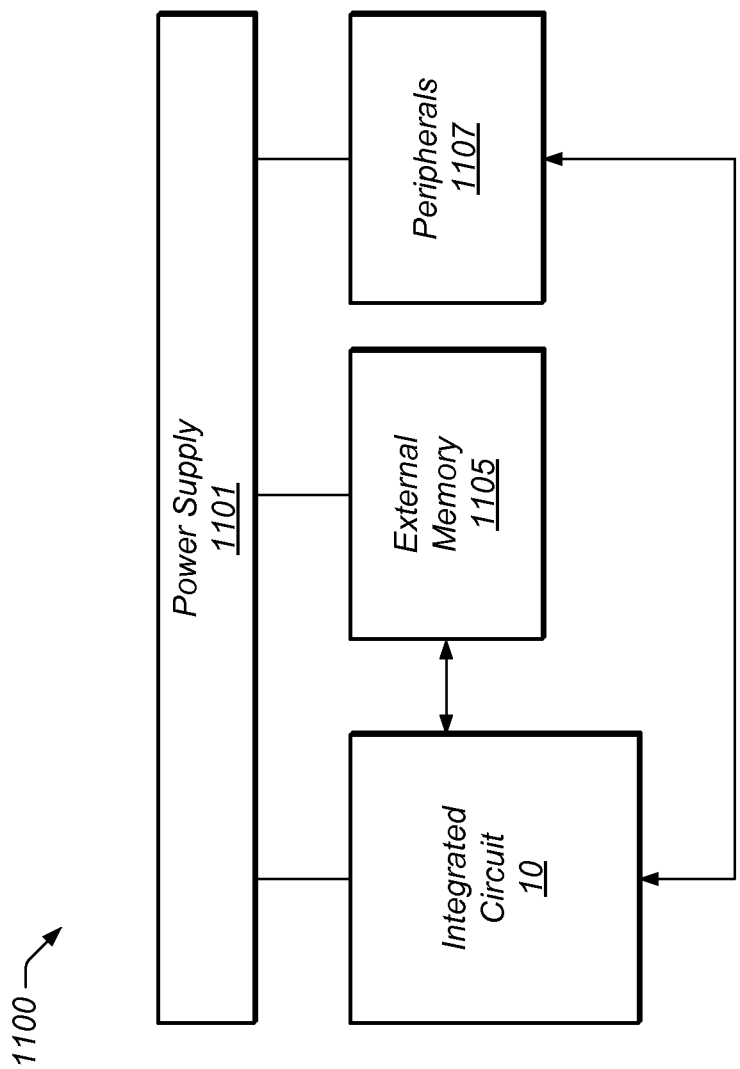
FIG. 11 is a block diagram of one embodiment of a system including the integrated circuit of FIG. 1.

Turning to FIG. 11, a block diagram of one embodiment of a system that includes the integrated circuit 10 of FIG. 1 is shown. The system 1100 includes at least one instance of the integrated circuit 10 of FIG. 1 coupled to one or more peripherals 1107 and an external system memory 1105. The system 1100 also includes a power supply 1101 that may provide one or more supply voltages to the integrated circuit 10 as well as one or more supply voltages to the memory 1105 and/or the peripherals 1107. In some embodiments, more than one instance of the integrated circuit 10 may be included.

The peripherals 1107 may include any desired circuitry, depending on the type of system. For example, in one embodiment, the system 1100 may be included in a mobile device (e.g., personal digital assistant (PDA), smart phone, etc.) and the peripherals 1107 may include devices for various types of wireless communication, such as WiFi, Bluetooth, cellular, global positioning system, etc. The peripherals 1107 may also include additional storage, including RAM storage, solid-state storage, or disk storage. The peripherals 1107 may include user interface devices such as a display screen, including touch display screens or multitouch display screens, keyboard or other input devices, microphones, speakers, etc. In other embodiments, the system 1100 may be included in any type of computing system (e.g., desktop personal computer, laptop, tablet, workstation, net top, etc.).

The system memory 1105 may include any type of memory. For example, the system memory 1105 may be in the DRAM family such as synchronous DRAM (SDRAM), double data rate (DDR, DDR2, DDR3, etc.), or any low power version thereof. However, system memory 1105 may also be implemented in SDRAM, static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processor comprising:
a translation lookaside buffer (TLB) unit including:
a data array including a plurality of entries each configured to store a respective translated physical address, wherein in response to a read access to a given entry, the data array is configured to output within a particular clock cycle, the respective translated physical address stored in the given entry;
wherein the data array includes a plurality of differential sense amplifiers configured to output inverted differential input bit representations of each bit of the translated physical address such that each bit of the translated physical address is precharged to an output logic value of zero during a portion of the particular clock cycle; and
a compare unit coupled to the sense amplifier outputs of the data array and configured to compare, during a remaining portion of the particular clock cycle, the respective translated physical address output by the data array with a plurality of additional addresses;

wherein the compare unit is configured to provide a hit indication for each of the plurality of additional addresses within the particular clock cycle.

2. The processor as recited in claim 1, wherein each of the plurality of additional addresses corresponds to an outstanding request that has not been serviced.

3. The processor as recited in claim 1, wherein the data array includes an integrated multiplexer coupled to an output of the data array and configured to bit-wise select as the output of the data array one of the translated physical address or another address provided to the data array from external to the TLB in response to the given entry being accessed.

4. The processor as recited in claim 3, wherein each of the plurality of entries is further configured to store an address selection indication, wherein the address selection indication is configured to select the one of the respective translated physical address stored within a particular entry or the another address as an output of the integrated multiplexer.

5. The processor as recited in claim 1, wherein the compare unit is coupled to the sense amplifier outputs and configured to perform a bit-wise compare of each differential bit representation of the translated physical address with a corresponding respective bit of each of a plurality of additional addresses 6. A method comprising:
storing a respective physical address translation within at least one entry of a translation lookaside buffer including a data array having a plurality of entries;
in response to a read access of a given entry, the data array outputting within a particular clock cycle, the respective translated physical address stored in the given entry;
a plurality of differential sense amplifiers within the data array outputting inverted differential input bit representations of each bit of the translated physical address such that each bit of the translated physical address is precharged to an output logic value of zero during a portion of the particular clock cycle;
comparing the respective translated physical address output by the data array with a plurality of additional addresses, during a remaining portion of the particular clock cycle; and
providing a hit indication for each of the plurality of additional addresses within the particular clock cycle.

7. The method as recited in claim 6, wherein at least some of the plurality of additional addresses correspond to outstanding memory write requests that have not been serviced.

8. The method as recited in claim 7, further comprising storing an address selection indication within each entry of the plurality of entries, wherein the address selection indication is configured to select the one of the respective translated physical address stored within a particular entry or another address provided to the TLB externally.

9. The method as recited in claim 8, further comprising the data array providing as an output to the compare unit either the respective translated physical address or the another address based upon the address selection indication in response to accessing a given entry of the plurality of entries.

10. A translation lookaside buffer (TLB) comprising:
a data array including a plurality of entries, wherein each entry is configured to store a respective translated physical address;

wherein in response to a read access to a given entry, the data array is configured to output within a particular clock cycle, the respective translated physical address stored in the given entry;

wherein the data array includes a plurality of differential sense amplifiers configured to output inverted differential input bit representations of each bit of the translated physical address such that each bit of the translated physical address is precharged to an output logic value of zero during a portion of the particular clock cycle; and a compare unit coupled to the sense amplifier outputs of the data array and configured to concurrently compare, during a remaining portion of the particular clock cycle, the respective translated physical address output by the data array with a plurality of additional addresses, and to provide a hit indication for each of the plurality of additional addresses within the particular clock cycle.

11. The TLB as recited in claim 10, wherein at least some of the plurality of additional addresses correspond to outstanding memory write requests that have not been serviced.

12. The TLB as recited in claim 11, wherein the data array further includes a multiplexer configured to provide as the output of the data array one of the respective translated physical address or another address dependent upon which of a wordline driver of the data array for the translated physical address stored within the entry or a wordline driver of the data array for the another address is enabled.

13. The TLB as recited in claim 11, wherein the compare unit includes a plurality of differential compare circuits, each configured to compare a different bit of the bits of the given translated physical address against a complement of the corresponding respective bit of each of a plurality of additional addresses, and to compare a complement of the different bit of the given translated physical address against the corresponding respective bit of each of a plurality of additional addresses to produce the hit indication for each of the plurality of additional addresses.

14. The TLB as recited in claim 13, wherein the compare unit includes a latch unit coupled to the plurality of differential compare circuits and configured to latch and output the hit indication for each of the plurality of additional addresses.

15. A translation lookaside buffer (TLB) comprising:
a data array unit configured to output within a particular clock cycle, a translated physical address in response to a read request to a particular entry;
wherein the data array unit includes a plurality of differential sense amplifiers configured to output inverted differential input bit representations of each bit of the translated physical address such that each bit of the translated physical address is precharged to an output logic value of zero during a portion of the particular clock cycle;
a compare unit coupled to the sense amplifier outputs of the data array unit and configured to concurrently compare, during a remaining portion of the particular clock cycle, the translated physical address with a plurality of additional addresses, and to provide a hit indication for each of the plurality of additional addresses within the particular clock cycle.

16. A mobile communication device comprising:
a memory; and
a processor coupled to the memory, wherein the processor includes a translation lookaside buffer (TLB) unit including:
a data array unit configured to output within a particular clock cycle, a translated physical address in response to a read request to a particular entry of the data array unit;

wherein the data array unit includes a plurality of differential sense amplifiers configured to output inverted differential input bit representations of each bit of the translated physical address such that each bit of the translated physical address is precharged to an output logic value of zero during a portion of the particular clock cycle; and a compare unit coupled to the sense amplifier outputs of the data array unit and configured to concurrently compare, during a remaining portion of the particular clock cycle, the translated physical address with a plurality of additional addresses, and to provide a hit indication for each of the plurality of additional addresses within the particular clock cycle.

17. The device as recited in claim 16, wherein at least some of the plurality of additional addresses correspond to an outstanding write request that has not been serviced.

18. The device as recited in claim 16, wherein the data array unit further includes a multiplexer configured to provide as the output of the data array unit one of the translated physical address or another address provided to the TLB dependent upon an address selection indication.

19. The device as recited in claim 18, wherein data array unit is configured to store the address selection indication with the translated physical address in the particular entry during a write operation to TLB.

\* \* \* \* \*